United States Patent [19]

Klüpfel

[11] 4,272,609

[45] Jun. 9, 1981

[54] PHOTOPOLYMERIZABLE MIXTURE

[75] Inventor: Kurt Klüpfel, Wiesbaden, Fed. Rep. of Germany

[73] Assignee: Hoechst Aktiengesellschaft, Fed. Rep. of Germany

[21] Appl. No.: 95,363

[22] Filed: Nov. 19, 1979

[30] Foreign Application Priority Data

Nov. 22, 1978 [DE] Fed. Rep. of Germany ....... 2850585

[51] Int. Cl.³ .............................................. G03C 1/68
[52] U.S. Cl. .................................... 430/288; 430/283; 430/286; 430/916; 430/920; 430/281; 525/6; 525/256; 525/279; 526/259; 526/204; 204/159.15; 204/159.16; 204/159.23
[58] Field of Search .............. 430/916, 920, 343, 281, 430/288, 286, 283; 204/159.16, 159.23, 159.15; 525/6, 256, 279; 526/259, 204

[56] References Cited

U.S. PATENT DOCUMENTS

| Re. 27,925 | 2/1974 | Jenkins et al. ................ 430/920 |
|---|---|---|
| 3,095,303 | 6/1963 | Sprague et al. ................ 430/292 |
| 3,751,259 | 8/1973 | Bauer et al. ................... 430/920 |
| 3,765,898 | 10/1973 | Bauer et al. ................... 430/920 |
| 3,769,023 | 10/1973 | Lewis et al. ................... 430/281 |
| 3,954,475 | 5/1976 | Bonham et al. ................ 430/916 |
| 4,065,315 | 12/1977 | Yamazaki et al. .............. 430/916 |
| 4,077,805 | 3/1978 | Asakawa et al. ............... 430/343 |

Primary Examiner—Won H. Louie, Jr.
Attorney, Agent, or Firm—James E. Bryan

[57] ABSTRACT

A photopolymerizable mixture for the preparation of printing plates and photoresists is disclosed which contains a polymeric binder, an ethylenically unsaturated polymerizable compound and, as a photoinitiator, a compound having the formula

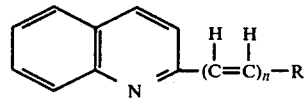

wherein R is an aromatic group which may be substituted and n is 1 or 2.

6 Claims, No Drawings

PHOTOPOLYMERIZABLE MIXTURE

This invention relates to a novel photopolymerizable mixture which contains as essential constituents at least one binder, at least one polymerizable compound, and at least one photoinitiator.

From German Pat. No. 2,027,467, particular derivatives of acridine and phenazine are known as photoinitiators.

German Pat. No. 2,039,861, describes derivatives of quinoxaline and quinazoline which are used for the same purpose.

It is an object of the present invention to provide further highly active photoinitiators.

The invention is based upon a photopolymerizable mixture which contains a polymeric binder, a polymerizable compound having at least one terminal ethylenic double bond and a boiling point above 100° C., and a polynuclear heterocyclic compound as a photoinitiator.

In the mixture according to the invention the photoinitiator is a compound having the formula

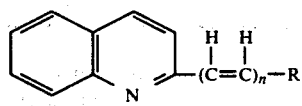

wherein R is an aromatic group which may be substituted and n is 1 or 2.

The photoinitiators contained in the mixture according to the invention absorb light in the spectral range from about 250 to 395 nm, and upon irradiation within this spectral range they function as active free-radical initiators for the photopolymerization of vinyl compounds, even in the presence of oxygen. At the same time, the novel photoinitiators have the property of inhibiting the thermal polymerization of compounds of this kind in the absence of actinic radiation. They are thus ideal for the manufacture of storable photopolymerizable mixtures. The mixtures so prepared also have good screen reproduction.

Suitable substituents in the aromatic group R are, among other, alkyl, aryl, aralkyl, alkoxy, aryloxy, acyl, acylamino, aminocarbonyl, arylamino, alkylmercapto, arylmercapto, dialkylamino and hydroxy groups and halogen atoms. Aliphatic substituents have generally from 1 to 6, preferably from 1 to 3 carbon atoms; substituents which contain aromatic groups have generally from 6 to 10 carbon atoms. Alkyl, alkoxy, aryl, carboxylic acid amide or hydroxy groups or halogen atoms are preferred.

The aromatic group may be a carbocyclic or heterocyclic mononuclear or polynuclear aromatic group, which also may contain hydrogenated rings linked thereto. Preferably, the aromatic group contains, at the most, three rings. 4-methoxy-benzalquinaldine, 4-methyl-benzalquinaldine, 4-chloro-benzalquinaldine, 2-(4-phenyl-butadienyl)-quinoline, 2-(2-phenanthryl-(3)-vinyl)-quinoline and 2-(2-benzo(2)thienyl-(3)-vinyl)-quinoline have proved to be particularly effective compounds.

The initiators are usually employed in a concentration in the range of 0.01 to 10, preferably from 0.2 to 7 percent by weight, relative to the weight of the polymerizable compounds.

Many of the compounds which are here used as photoinitiators are known from the literature. The active hydrogen of the methyl group of 2-methyl-quinoline allows an easy condensation with aromatic aldehydes at about 150° C. by splitting off water, to form the desired benzalquinaldines and their derivatives and homologues, respectively.

Suitable polymerizable compounds are compounds having terminal vinyl or vinylidene groups which are capable of a radically initiated chain polymerization. Among these, the acrylic and methacrylic acid derivatives, above all, the esters, are particularly suitable. Especially preferred are compounds which contain at least two polymerizable groups.

Examples of suitable compounds are the acrylic and methacrylic acid esters of ethylene glycol, polyethylene glycol, trimethylol propane, pentaerythritol, dipentaerythritol and similar polyvalent alcohols. Particularly suitable are also polymerizable compounds which have at least two urethane groups in their molecules and which have been described, for example, in German Offenlegungsschriften Nos. 2,064,079 and 2,361,041 and in the previous German patent application No. P 2,822,190.

In general, the polymerizable compounds are used in a quantity ranging from 10 to 70, preferably from 20 to 50 percent by weight, relative to the total quantity of the non-volatile constituents of the mixture.

The photopolymerizable mixtures may contain one or several binders, as is generally known, for example, polyamides, polyvinyl acetates, polymethyl methacrylates, polyvinyl acetals, unsaturated polyesters which are soluble in solvents, polymers which are soluble or swellable or softenable in an aqueous alkaline medium, for example, styrene/maleic anhydride copolymers, maleic/maleate resins and the like. Because development is frequently carried out with aqueous alkaline developers, binders which are alkali-soluble or softenable in aqueous alkaline media are preferably employed. Binders of this kind are, for example, copolymers of styrene and maleic anhydride, of vinyl acetate and crotonic acid and of alkyl acrylates or alkyl methacrylates with acrylic acid or methacrylic acid. Copolymers of methacrylic acid, e.g. terpolymers with higher molecular weight alkyl methacrylates and further monomers, which are, for example, described in German Offenlegungsschriften Nos. 2,064,080 and 2,363,806, are particularly suitable.

The binders are usually contained in the mixture in a quantity ranging from 20 to 80, preferably from 35 to 65 percent by weight, relative to the quantity of the non-volatile constituents.

Furthermore, dyes, pigments, polymerization inhibitors, color precursors and hydrogen donors may be added to the mixtures. Preferably, however, these additions should not absorb excessive amounts of the actinic light which is required for the initiating process. As suitable hydrogen donors, substances are, for example, known which have aliphatic ether bonds. If appropriate, this function also may be assumed by the binder or by the polymerizable substance, so that additional hydrogen donors become unnecessary.

To improve the elasticity, the mixtures according to the invention also may contain plasticizers, such as polyglycols, esters of p-hydroxybenzoic acid, and the like.

The mixtures preferably are used in the manufacture of letterpress printing forms, relief images, offset printing forms, bimetal and trimetal printing forms, printed circuits, screen printing stencils and printing forms for screenless offset printing.

If the mixture is stored in the form of a liquid, as a so-called photoresist composition, for application to the substrate, e.g. a screen printing support, a circuit board or the like, immediately prior to use, the layer constituents are dissolved or dispersed in a suitable solvent or solvent mixture. Suitable solvents are, for example, alcohols, ketones, esters, ethers, amides and hydrocarbons. In the first place, the partial ethers of polyvalent alcohols, particularly the partial ethers of glycols, are used.

For the manufacture of printing plates and the like, the mixtures advantageously may be applied to suitable supports immediately after the preparation of the mixtures, and the materials so prepared then may be stored and marketed as light-sensitive copying materials. The solvents used for this purpose may be the same as or similar to the solvents used for the preparation of the photoresist compositions. The mixtures are applied, for example, by casting, spray, dip or roller coating.

Suitable supports are, for example, zinc, copper, aluminum, steel, polyester or acetate film, Perlon ® gauze, and the like, the surfaces of which may have been subjected to a conditioning treatment, if required.

If necessary, an adhesion-promoting interlayer or an antihalation layer may be applied between the support and the light-sensitive layer.

For the preparation of thick photopolymer layers which may have a thickness amounting to some tenths of a millimeter, the copying composition according to the invention may be kneaded, for example, in a three roller mill, without dissolving it in a solvent, and may be hydraulically pressed upon the support film.

The printing forms, etch resists, screen printing forms and the like are prepared from suitable materials in a manner which is conventionally employed in practice, i.e. following exposure under an original, the non-hardened non-image areas are removed by treating with suitable solvents or aqueous alkaline solutions, respectively.

TABLE I

General Formula:

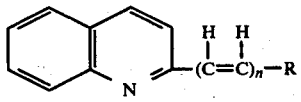

| Comp. No. | FP °C. | λmax. nm | fluorescence 366 nm | n | R |
|---|---|---|---|---|---|
| 1 | 98 | 286 (345) | blue | 1 | phenyl |
| 2 | 124–125 | 359 | intensely blue | 1 | 4-methoxy phenyl |
| 3 | 103–104 | 362 | intensely blue | 1 | 3,4-dimethoxy phenyl |
| 4 | 126–127 | 344 | greenish-yellow | 1 | 4-methyl phenyl |
| 5 | 78 | 285 (330) | blue | 1 | 2-chloro phenyl |
| 6 | 94–95 | 283 (346) | blue-violet | 1 | 3-chloro phenyl |
| 7 | 143 | 287 (342) | blue | 1 | 4-chloro phenyl |
| 8 | 118 | 357 | intensely blue | 2 | phenyl |
| 9 | 136 | 372 | intensely yellowish-green | 2 | 4-methoxy phenyl |
| 10 | 93–94 | 305 (352) | greenish-yellow | 1 | naphthyl-(1) |
| 11 | 185 | 253 (395) | intensely yellow | 1 | anthryl-(9) |
| 12 | 153 | 275 | light yellow | 1 | phenanthryl-(3) |

TABLE I-continued

General Formula:

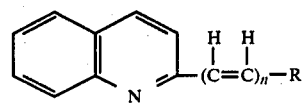

| Comp. No. | FP °C. | λmax. nm | fluorescence 366 nm | n | R |
|---|---|---|---|---|---|
| 13 | 200 | (358) 360 | ocher-yellow | 1 | fluorenyl-(2) |
| 14 | 280 | 375 | intensely greenish-yellow | 1 | diphenylyl-(4) |
| 15 | 132–133 | 264 (362) | greenish-yellow | 1 | acenaphthyl-(5) |
| 16 | 59–61 | 357 | yellow | 1 | benzo(2) thienyl-(3) |
| 17 | 57–59 | 352 | faintly yellow | 1 | furyl-(2) |
| 18 | 88–90 | 270 (344) | light yellow | 1 | pyridyl-(2) |
| 19 | 221–223 | 256 (370) | yellowish-gray | 1 | 2-hydroxy-naphthyl-(1) |
| 20 | 155–157 | — | ocher-yellow | 1 | 2-hydroxy-3-anilido-carbonyl-naphthyl-(1) |

The preparation of the benzalquinaldines has been described in the reports of "Deutsche Chem. Gesellschaft" (German Chem. Society), Report No. 36, 1666; Report No. 39, 2750; and Report No. 59, 1013.

Benzalquinaldines which have not been described in the literature and their homologues were subjected to a nitrogen analysis.

The nitrogen values calculated and found for these novel compounds which are among the compounds listed in Table I are given in Table Ia.

TABLE Ia

| Compound No. | 2 | 3 | 4 | 9 | 10 | 11 | 12 | 13 |
|---|---|---|---|---|---|---|---|---|
| N calc. | 5.36 | 4.81 | 5.72 | 4.87 | 4.96 | 4.23 | 4.23 | 4.54 |
| N found | 5.20 | 4.80 | 5.80 | 4.82 | 5.00 | 4.21 | 4.20 | 4.32 |

| Compound No. | 14 | 15 | 16 | 17 | 18 | 19 | 20 |
|---|---|---|---|---|---|---|---|
| N calc. | 6.08 | 4.56 | 4.84 | 6.33 | 12.10 | 4.70 | 6.72 |
| N found | 6.02 | 4.40 | 4.62 | 6.35 | 12.06 | 4.76 | 7.20 |

The starting activities of the initiators of formulae 1 to 20 are summed up in Table II of Example 1.

In Example 2, some of the photoinitiators of Table I are added in greater quantities and the light-sensitivities are given in fully cross-linked steps of the wedge.

In Examples 3 to 6, other photopolymer layers and other applicabilities are described.

The quantities of the constituents are given in parts by weight (p.b.w.). If not otherwise specified, the quantitative ratios and percentages are units of weight.

EXAMPLE 1

20 solutions each of
5.6 p.b.w. of the reaction procuct of 1 mole of 2,2,4-trimethylhexamethylene diisocyanate and 2 moles of 2-hydroxyethyl methacrylate,
6.5 p.b.w. of a terpolymer of styrene, n-hexyl-methacrylate and methacrylic acid (10:60:30), having an acid number of 190,
0.2 p.b.w. of a photoinitiator (see Table II),
0.15 p.b.w. of triethylene glycol dimethacrylate and 0.035 p.b.w. of a blue azo dye, obtained by coupling 2,4-dinitro-6-chloro-benzene diazonium salt with 2-methoxy-5-acetylamino-N-cyanoethyl-N-hydroxyethyl aniline in 30 p.b.w. of butanone, and 0.5 p.b.w. of ethyl alcohol were, one by one, whirler-coated onto a 25 $\mu$m thick polyethylene terephthalate film. After drying for 2 minutes in a drying cabinet at 100° C., the layers obtained had a thickness of 25 $\mu$m (30 g/m$^2$).

To protect the resulting layers from soiling by dust and damage they were covered with a 20 to 25 $\mu$m thick cover film of polyethylene which adhered less strongly to the layers than the polyester carrier film. It was thus possible to store the layers in the absence of light for a prolonged period of time.

Phenoplast laminates to which 35 $\mu$m thick copper foils had been laminated, were mechanically cleaned on their copper surfaces using pumice powder or a brushing machine, and after thoroughly rinsing with water the surfaces were dried with a blast of oil-free air.

After peeling off the cover films, the dry resists were laminated to the pre-cleaned copper surfaces with the aid of a commercially available laminator, at 120° C. and a speed of 1.5 m/min.

Each of the 20 samples of the resists laminated to the copper surfaces was divided into three parts and subsequently exposed for 10, 20 and 40 seconds each through the carrier film under a 13 step exposure wedge with density increments of 0.15, using a 5 kW metal halide lamp.

The zero step of the wedge corresponded to an optical density of 0.05 (intrinsic absorption of the film material).

The carrier films were then stripped and the plates were spray developed with an 0.8 percent concentration soda solution at 25° C. The developing time was about 60 seconds.

To test the developer resistance—a test which is carried out to determine if the wedge steps are fully cross-linked—the samples exposed for 20 seconds were additionally subjected to three times the developing time, i.e. development for 180 seconds (Table II, last column).

The fully cross-linked wedge steps of the developed dry resist layers were counted and listed in the table which follows. The numbers of steps in brackets include steps which were not fully cross-linked and slightly attacked by the developer.

TABLE II

| Initiator Compound No. | Full Shade Steps | | | after development for 180 seconds |
|---|---|---|---|---|
| | 10 s. | 20 s. | 40 s. | |
| 1 | 2 | 4 | 6 | 3 |
| 2 | 2 | 4 | 6 | 3 |
| 3 | 1 | 3 | 5 | 2 |
| 4 | 2 | 4 | 6 | 3 |
| 5 | 1 | 3 | 5 | 2 |
| 6 | 1 | 3 | 4 (5) | 2 |
| 7 | 2 | 4 | 6 | 3 |
| 8 | 3 | 5 | 7 | 4 |
| 9 | 1 | 3 | 5 | 2 |
| 10 | 4 | 6 | 8 | 5 |
| 11 | 0 | 0 | 1 | — |
| 12 | 4 | 6 | 8 | 5 |
| 13 | 3 | 5 | 7 | 4 |
| 14 | 0 | 1 | 2 | (1) |
| 15 | 1 | 3 | 5 | 2 |
| 16 | 2 | 4 | 6 | 3 |
| 17 | 0 | 1 | 2 | (1) |

TABLE II-continued

| Initiator Compound No. | Full Shade Steps | | | after development for 180 seconds |
|---|---|---|---|---|
| | 10 s. | 20 s. | 40 s. | |
| 18 | 0 | 1 | 3 | (1) |
| 19 | 1 | 2 | 4 | 1 |
| 20 | 0 | 0 | 1 | — |

EXAMPLE 2

0.4 g each of compounds 2, 4, 7, 8, 12, and 16, were added to the photopolymerizable mixture described in Example 1, and a 25 $\mu$m thick polyethylene terephthalate film was whirler-coated with the respective solution in such a manner that after drying a 25 $\mu$m thick (30 g/m$^2$) layer was obtained.

In the same way as in Example 1, the layer was applied to the cleaned copper surface of a 10×15 cm Cu laminate and was then exposed through the carrier film and developed with an 0.8 percent concentration aqueous soda solution.

The resulting cross-linked wedge steps are listed in Table III.

TABLE III

| Compound No. | Full Shade Steps | | |
|---|---|---|---|
| | 10 s | 20 s | 40 s |
| 2 | 4 | 6 | 8 |
| 4 | 3 | 6 | 8 |
| 7 | 3 | 5 | 7 |
| 8 | 5 | 7 | 9 |
| 12 | 4 | 7 | 9 |
| 16 | 3 | 5 | 7 |

Due to the intrinsic absorption of the initiator, an increase of the initiator concentration to over 0.4 g does, as a rule, not result in a further augmentation of the light-sensitivity.

EXAMPLE 3

A solution of 4.0 p.b.w. of a copolymer of methyl methacrylate and methacrylic acid (82:18) having an acid number of 110, 4.0 p.b.w. of trimethylol ethane triacrylate, 0.08 p.b.w. of the dye used in Example 1 and 0.21 p.b.w. of compound 7 in 38 p.b.w. of glycol monoethyl ether and 18 p.b.w. of butyl acetate was whirler-coated onto 0.3 mm thick aluminum which had been electrolytically roughened and hardened by anodizing, and was then dried, so that a layer weighing 2.5 g/m$^2$ was obtained.

After drying, the photopolymerizable layer was overcoated with a solution of 5 p.b.w. of polyvinyl alcohol having a K-value of 8 and containing 12 percent of unsaponified acetyl groups in 95 p.b.w. of deionized water and dried, so that a peelable cover layer of 5 g/m$^2$ was formed.

The source of light specified in Example 1 was then used for exposure during 40 seconds under a 13 step exposure wedge.

The exposed layer was developed for about 1 minute using a plush pad and a developer composed of 1.5 p.b.w. of sodium metasilicate.9H$_2$O, 0.01 p.b.w. of a fatty alcohol polyglycol ether and
0.2 p.b.w. of strontium chloride.6H₂O
in
98.3 p.b.w. of deionized water.

5 full shade wedge steps were obtained.

The plate was rinsed with water and then treated with a 1 percent concentration phosphoric acid and inked with a conventional greasy ink.

After inking, the plate was gummed and dried.

In an offset printing machine 150,000 prints were obtained.

EXAMPLE 4

A coating solution of
1.0 p.b.w. of trimethylol ethane triacrylate,
1.4 p.b.w. of a terpolymer of n-hexylmethacrylate/-methyl methacrylate/methacrylic acid (50:25:25), having an acid number of 160,
0.02 b.p.w. of Methyl Violet (C.I. 42 535), and
0.05 p.b.w. of compound 12
in
6.0 p.b.w. of butanone
was whirler-coated onto a cleaned zinc plate suitable for powderless etching and then dried, so that a layer weighing about 10 g/m² was obtained.

Then, the copying material was provided with a 1 to 2 μm thick coating of polyvinyl alcohol, dried and exposed for 40 seconds under a positive original by means of the source of light specified in Example 1. The zinc plate was developed for 45 seconds using a developer composed of 1.5 p.b.w. of sodium metasilicate nonahydrate,
0.3 p.b.w. of polyethylene glycol having an average molecular weight of 6000,
0.3 p.b.w. of levulinic acid, and
0.3 p.b.w. of strontium hydroxide octahydrate in
97.6 p.b.w. of deionized water.

After thoroughly rinsing with water, etching was carried out for 5 minutes using a 10 percent concentration nitric acid with an addition of an edge protecting agent. The hardened photopolymer layer was removed with ethylene glycol monobutyl ether. The printing form thus obtained was suitable for high quality letterpress printing.

EXAMPLE 5

A coating solution such as that described in Example 4, but containing 0.05 p.b.w. of compound 16 instead of compound 12 was applied by casting onto a 25 μm thick polyethylene terephthalate film. It was then dried for 2 minutes at 100° C. in a drying cabinet. The layer obtained had a thickness of 20 μm (26 g/m²).

Together with the polyester film, the dried layer was laminated to a conventional screen printing fabric, by means of a commercially available laminator, exerting the maximum contact pressure at a temperature of 115° C. and a speed of 1 m/min.

Exposure was then carried out for 60 seconds through the polyester film under a positive original, using the source of light specified in Example 1.

Following stripping of the polyester film, the image areas which had not been cross-linked were removed in 45 seconds using the developer described in Example 4 in a bath which was moved up and down. The screen printing form was ready for use after it had been thoroughly rinsed with water and dried.

EXAMPLE 6

A solution having the following composition:

1.0 p.b.w. of trimethylol ethane triacrylate,
1.4 p.b.w. of the terpolymer described in Example 4,
0.02 p.b.w. of the dye used in Example 1 and
0.05 p.b.w. of compound 8
in
8.0 p.b.w. of butanone
was whirler-coated onto a trimetal plate (Fe/Cu/Cr) which previously had been cleaned with water and trichloroethylene.

The layer was then dried for 2 minutes at 100° C. The thickness of the layer obtained was about 10 μm.

In a second step, the light-sensitive layer was overcoated with a 3 percent concentration aqueous polyvinyl alcohol solution and then dried, so that a cover layer having a thickness of about 4 μm was formed.

Following exposure for 120 seconds under a negative original using the source of light specified in Example 1, development was carried out for 60 seconds with the developer described in Example 4, in a bath which was moved up and down.

The light-hardened layer then was additionally tempered for 10 minutes at 100° C.

Then, the uncovered chromium was etched away within 5 minutes using a solution composed of 17.4 percent of CaCl₂, 35.3 percent of ZnCl₂, 2.1 percent of HCl and 45.2 percent of water, and the hardened photopolymer layer was removed with methylene chloride.

The plate was wiped over with a 1 percent concentration phosphoric acid and inked with a greasy ink. The trimetal plate then was ready for printing.

It will be obvious to those skilled in the art that many modifications may be made within the scope of the present invention without departing from the spirit thereof, and the invention includes all such modifications.

What is claimed is:

1. A photopolymerizable mixture comprising a polymeric binder, a polymerizable compound having at least one terminal ethylenic double bond and a boiling point above 100° C., and a photoinitiator having the formula

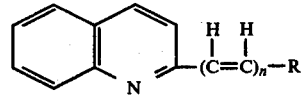

wherein
R is an aromatic group either unsubstituted or substituted by alkoxy, alkyl, aryl, hydroxy or carboxylic acid amide groups or by halogen atoms, and
n is 1 or 2.

2. A photopolymerizable mixture as claimed in claim 1 containing from 0.01 to 10 percent by weight of the photoinitiator, relative to the quantity of the polymerizable compound.

3. A photopolymerizable mixture as claimed in claim 1 in which n=1 and R is a methoxyphenyl, methylphenyl, naphthyl-(1), phenanthryl-(3) or benzo(2)thienyl-(3) group.

4. A photopolymerizable mixture as claimed in claim 1 in which n=2 and R is a phenyl group.

5. A photopolymerizable mixture as claimed in claim 1 in which the polymeric binder is insoluble in water and soluble in aqueous alkaline solutions.

6. A photopolymerizable mixture as claimed in claim 1 in which the polymerizable compound is an acrylic or methacrylic acid ester having at least two polymerizable groups.

* * * * *